(12) United States Patent
Kaneko

(10) Patent No.: US 8,754,336 B2
(45) Date of Patent: Jun. 17, 2014

(54) WIRING BOARD AND METHOD OF PRODUCING THE SAME

(75) Inventor: Kentaro Kaneko, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 58 days.

(21) Appl. No.: 13/427,235

(22) Filed: Mar. 22, 2012

(65) Prior Publication Data
US 2012/0175157 A1 Jul. 12, 2012

Related U.S. Application Data

(63) Continuation of application No. 12/626,025, filed on Nov. 25, 2009.

(30) Foreign Application Priority Data

Nov. 28, 2008 (JP) .................................. 2008-305154

(51) Int. Cl.
*H05K 1/11* (2006.01)

(52) U.S. Cl.
USPC ........... 174/261; 174/260; 174/262; 174/264; 174/265; 174/267; 361/767; 361/768

(58) Field of Classification Search
None
See application file for complete search history.

(56) References Cited

U.S. PATENT DOCUMENTS

| | | | |
|---|---|---|---|
| 5,329,695 A * | 7/1994 | Traskos et al. ................... | 29/830 |
| 5,658,611 A | 8/1997 | Ishido et al. | |
| 5,746,813 A | 5/1998 | Ishido et al. | |
| 5,900,674 A | 5/1999 | Wojnarowski et al. | |
| 6,043,990 A * | 3/2000 | Johnson et al. ................ | 361/803 |
| 6,225,569 B1 | 5/2001 | Hashimoto et al. | |
| 6,303,880 B1 | 10/2001 | Asai et al. | |
| 6,306,751 B1 | 10/2001 | Patel et al. | |
| 6,485,843 B1 | 11/2002 | Eslamy | |
| 6,730,539 B2 | 5/2004 | Park et al. | |
| 6,740,352 B2 | 5/2004 | Lee et al. | |
| 6,940,179 B2 | 9/2005 | Lee | |
| 7,041,591 B1 | 5/2006 | Lee et al. | |
| 7,257,891 B2 | 8/2007 | Lee et al. | |
| 7,271,498 B2 | 9/2007 | Huang | |
| 7,304,249 B2 | 12/2007 | Lee et al. | |

(Continued)

FOREIGN PATENT DOCUMENTS

| JP | 410012999 A | 1/1998 |
|---|---|---|
| JP | 2001-068858 | 3/2001 |

(Continued)

OTHER PUBLICATIONS

WO2008/001915 English translation.*

(Continued)

*Primary Examiner* — Tuan T Dinh
*Assistant Examiner* — Steven T Sawyer
(74) *Attorney, Agent, or Firm* — Rankin, Hill & Clark LLP

(57) ABSTRACT

A wiring board includes: wiring layers; insulating layers disposed between the wiring layers; and external connection pads respectively including surface plated layers, for connecting to an external circuit. In each of the external connection pads in one face of the wiring board, an outer peripheral edge of the external connection pad is retracted from an outer peripheral edge of the surface plated layer toward a center of the external connection pad.

15 Claims, 22 Drawing Sheets

(56) References Cited

U.S. PATENT DOCUMENTS

| | | |
|---|---|---|
| 7,568,922 B2 | 8/2009 | Yamashita et al. |
| 7,667,336 B2 | 2/2010 | Ishio |
| 2005/0208749 A1 | 9/2005 | Beckman et al. |
| 2006/0102384 A1* | 5/2006 | Watanabe et al. ............. 174/256 |
| 2006/0121719 A1* | 6/2006 | Nakamura et al. ............ 438/613 |
| 2006/0246706 A1 | 11/2006 | Ke et al. |
| 2007/0045847 A1 | 3/2007 | Arai et al. |
| 2008/0246146 A1* | 10/2008 | Kodani et al. ................. 257/737 |
| 2009/0315190 A1 | 12/2009 | Kikuchi et al. |
| 2010/0019347 A1* | 1/2010 | McLellan et al. ............. 257/532 |

FOREIGN PATENT DOCUMENTS

| | | |
|---|---|---|
| JP | 2003-039219 | 5/2003 |
| JP | 02005229138 A | 8/2005 |
| JP | 02005276892 A | 10/2005 |
| WO | 2008/001915 | 1/2008 |

OTHER PUBLICATIONS

Japanese Office Action and English translation dated Jan. 7, 2014, 4 pages.

\* cited by examiner

WIRING BOARD AND METHOD OF PRODUCING THE SAME

This application claims priority from Japanese Patent Application No. 2008-305154, filed on Nov. 28, 2008, the entire contents of which are hereby incorporated by reference.

FIELD OF THE INVENTION

The present invention relates to a wiring board and a method of producing the same, and more particularly to a wiring board of a type in which pads for mounting a semiconductor chip or the like are disposed on one face, and pads for connecting with another mounting board are disposed on the other face.

DESCRIPTION OF RELATED ART

In a wiring board which is used, for example, in packaging of electronic components such as a semiconductor chip, pads for mounting a semiconductor chip, an electronic component, or the like are disposed on one face, and pads for connecting with another mounting board are disposed on the other face. In order to attain joining with solder bumps which are used for connections with a semiconductor chip or the like, and those with a mounting board, a surface plated layer is formed on each surface of such external connection pads. A surface plated layer is formed by thinly plating nickel (Ni), gold (Au), and the like from the side of the pad.

FIG. 27 shows an example of an external connection pad in a wiring board which is produced by a usual build-up technique. The external connection pad 101 is formed on the outermost insulating layer 102 of the wiring board, by a conductor material such as copper (Cu), and, at a position corresponding to the external connection pad 101, connected through a via 105 which is passed through an insulating layer 102, to a pad 104 which is formed in one end of a lower wiring 103. A solder resist layer 106 is disposed on the outermost surface of the board, and an opening portion 107 through which a part of the upper face of the external connection pad 101 is exposed is formed in the solder resist layer 106. A surface plated layer 108 is placed on the exposed upper face of the external connection pad 101.

As a method of producing a wiring board, Domestic Republication of PCT Patent Application No. 2003/039219 discloses in which a core board for alternately forming a wiring layer and an insulating layer on both the front and rear faces of the wiring board by a build-up technique is not used, external connection pads are first formed together with surface plated layers on a support member such as a copper plate, a required number of wiring layers and insulating layers are formed on the external connection pads by a build-up technique, external connection pads are formed on the opposite side, and thereafter the support member is removed, thereby forming a wiring board.

FIG. 28 shows an example of an external connection pad (that is initially formed on the support member) on one face of the wiring board which is produced by the method. In the external connection pad 121, one side is covered by a surface plated layer 122, and the surface of the surface plated layer is exposed from that of the outermost insulating layer 123. The external connection pad 121 is connected through a via 124 which is passed through the insulating layer 123, to a pad 126 which is formed in one end of a lower wiring 125. An external connection pad on the other face of the board is configured in the same as that which has been described with reference to FIG. 27.

In the external connection pad 101 of FIG. 27, the opening portion 107 is formed in the solder resist layer 106 that is formed so as to cover the whole face of the board after the formation of the pad, and a part of the pad is exposed for connection with a semiconductor chip or an external circuit. Therefore, the pad 101 must be formed larger than the opening portion 107 of the solder resist layer. This configuration hinders miniaturization of wirings.

Since the external connection pad 101 is formed in a large size, the amount of a resin which is between the pad 101 and the pad 104 of the lower wiring (specifically, the resin which is surrounded by vertical broken lines A shown in FIG. 27, the lower face of the pad 101, the upper face of the pad 104, and the side face of the via 105) is large, and hence there is a possibility that the connection reliability of the via is lowered by, for example, formation of a crack in a connecting portion between the pads and the via and due to stress caused by heat shrinkage of the resin.

In the case of the external connection pad 121 of FIG. 28, it is possible to solve the above-discussed problems. However, the surface plated layer 122 and the pad 121 therebelow have the same size, and hence a crack 131 which is formed due to stress between the surface plated layer 122 and the insulating layer 123 easily propagates toward the interior of the insulating layer 123 along the side face of the pad 121, thereby producing breakage of the wiring or the like. Therefore, this disadvantage tends to cause the performance of the wiring board to be degraded.

SUMMARY OF INVENTION

Illustrative aspects of the present invention provide a wiring board and a method of producing the same in which external connection pads that do not hinder miniaturization of wirings, that can maintain the connection reliability of vias, and that hardly cause degradation of the performance of the wiring board are formed in one face of the wiring board.

According to a first aspect of the present invention, a wiring board includes: wiring layers; insulating layers disposed between the wiring layers; and external connection pads respectively including surface plated layers, for connecting to an external circuit. In each of the external connection pads in one face of the wiring board, an outer peripheral edge of the external connection pad is retracted from an outer peripheral edge of the surface plated layer toward a center of the external connection pad.

Other aspects and advantages of the invention will be apparent from the following description, the drawings and the claims.

DETAILED DESCRIPTION OF EXEMPLARY EMBODIMENTS

A wiring board of the present invention is characterized in that an outer peripheral edge of each of external connection pads in one face is retracted from an outer peripheral edge of a surface plated layer toward the center of the external connection pad.

Figure 1:
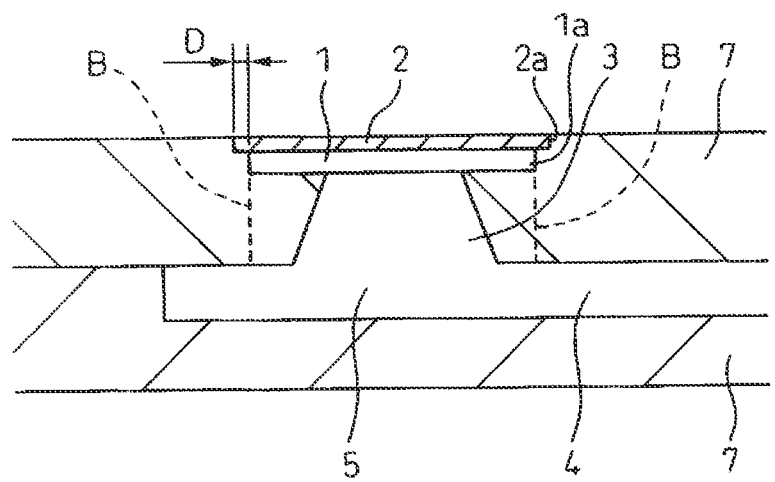
FIG. 1 is a view illustrating an external connection pad which is in the wiring board of the present invention, and in which the outer peripheral edge of the external connection pads is retracted from the outer peripheral edge of a surface plated layer toward the center of the external connection pad.

FIG. 1 shows an external connection pad 1. The pad 1 has a surface plated layer 2 on the side of connection to an external circuit. As an example, each of the pad 1 and the surface plated layer 2 is formed in a circular shape from a planar view. A center of the surface plated layer 2 coincides with a center of the pad 1. In the pad 1, an outer peripheral edge 1a is retracted from an outer peripheral edge 2a of the surface plated layer 2 toward the center of the pad 1, and positioned inside the outer peripheral edge 2a of the surface plated layer 2. In order to attain the object of the present invention, preferably, the pad 1 is made as small as possible. However, the lower limit of the size depends mainly on the production accuracy which is required for ensuring joining of the pad 1 and a via 3 for connecting the pad 1 to a wiring 4 in the board. By contrast, the size of the surface plated layer 2 which is joined to the pad 1 depends on that of a bump (not shown) which is to be connected. The actual size of the pad 1 should be determined in view of these dependencies. In a standard wiring board, for example, the horizontal distance (the length indicated by D in FIG. 1) between the outer peripheral edge 1a of the pad 1 and the outer peripheral edge 2a of the surface plated layer 2 may be set to be about 0.1 to 5 μm, preferably, about 1 to 3 μm.

Referring to FIG. 1, the via 3 is connected to the wiring 4 through a pad 5 which is at a position corresponding to the external connection pad 1, and which is positioned in one end of the wiring 4. The external connection pad 1, the surface plated layer 2, the via 3, the wiring 4, and the pad 5 connected to the wiring 4 are in an insulating layer 7 except the upper face of the surface plated layer 2.

Figure 27:
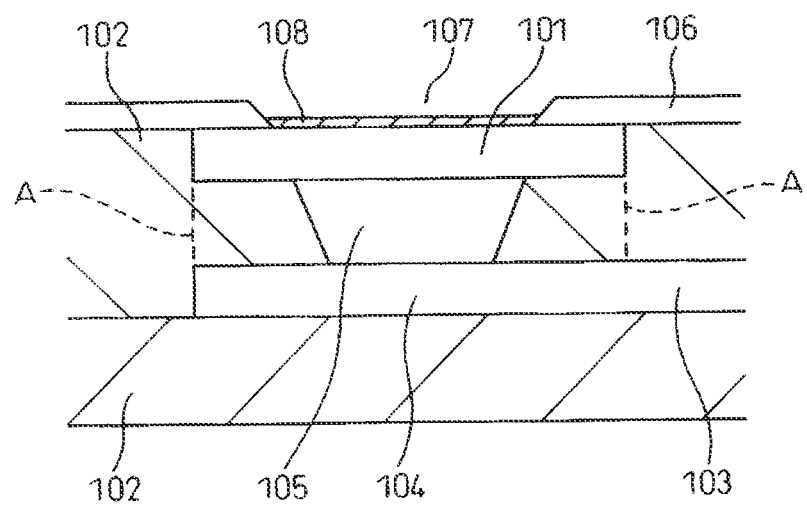
FIG. 27 is a view illustrating an external connection pad in a related-art wiring board which is produced by a build-up technique.

In the related art which has been described with reference to FIG. 27, the size of the opening portion 107 of the solder resist layer 106 which is connected to the pad 101 for connecting with an external circuit defines that of the surface plated layer 108 which is positioned there, and depends on that of a bump to be connected. Because, after the solder resist layer 106 which covers the pad 101 is formed, the opening portion 107 must be formed in the solder resist layer 101, the pad 101 must be formed to be larger than the opening portion 107 or larger than the surface plated layer 108. In this case, the outer peripheral edge of the pad 101 is inevitably positioned outside that of the surface plated layer 108.

In the present invention, by contrast, the outer peripheral edge 1a of the external connection pad 1 is retracted from the outer peripheral edge 2a of the surface plated layer 2 toward the center of the pad, and the former is positioned inside the latter (FIG. 1). The retraction of the outer peripheral edge 1a of the external connection pad 1 toward the center of the pad enables the wirings of the wiring board of the present invention to be miniaturized, and reduces the amount of a resin which is between the external connection pad 1 and the pad 5 connected to the inner wiring 4, i.e., a resin which is surrounded by vertical broken lines B shown in FIG. 1, the lower face of the pad 1, the upper face of the pad 5, and the side face of the via 3, as compared with the case of the related art which has been described with reference to FIG. 27. Therefore, it is possible to maintain the connection reliability of the via against stress caused by heat shrinkage of the resin.

Figure 28:
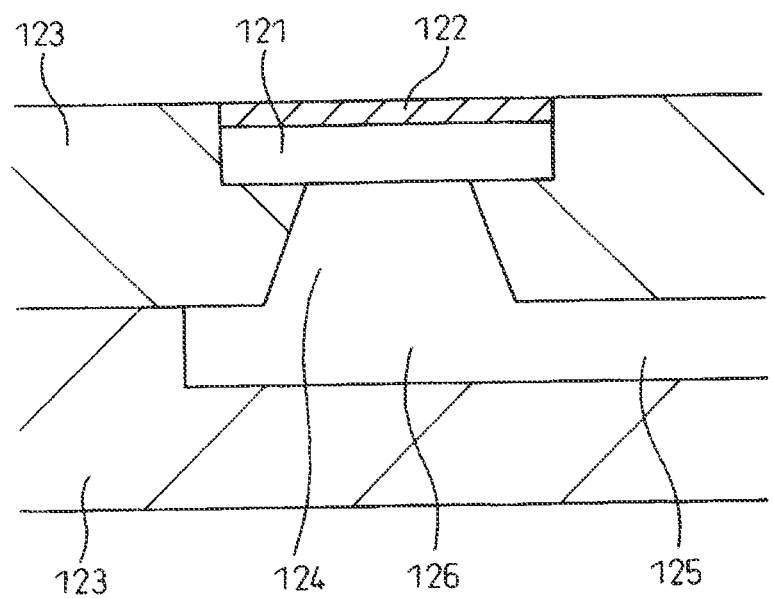
FIG. 28 is a view illustrating an external connection pad in another related-art wiring board.
Figure 29:
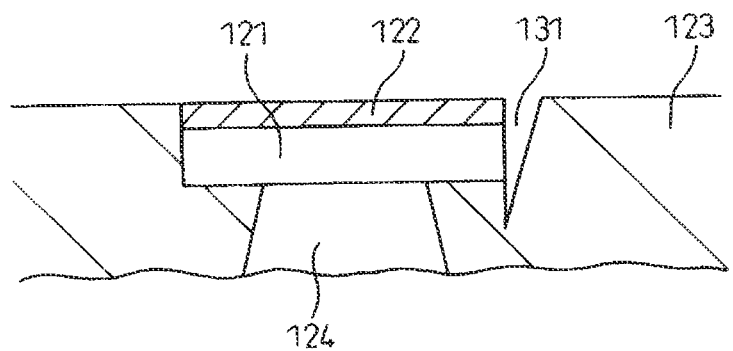
FIG. 29 is a view illustrating a crack which is formed between a surface plated layer and an insulating layer in a pad portion shown in FIG. 28.

In the related art which has been described with reference to FIG. 28, the crack 131 which is formed due to stress between the surface plated layer 122 and the insulating layer 123 easily propagates toward the interior of the insulating layer 123 along the side face of the pad 121 as shown in FIG. 29, and therefore there is a problem in that the propagation easily causes the performance of the wiring board to be degraded.

Figure 2:
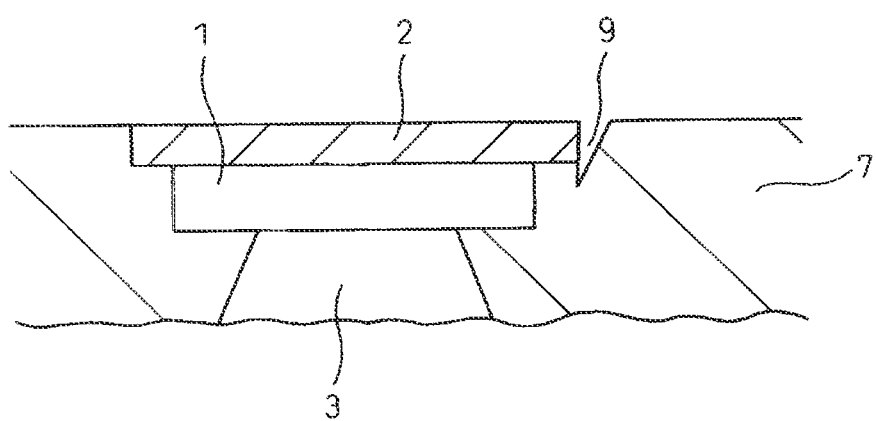
FIG. 2 is a view illustrating a crack which is formed between the surface plated layer and the insulating layer in the wiring board of the present invention.

In the present invention, by contrast, a crack 9 which is formed between the surface plated layer 2 and the insulating layer 7 propagates along the side face of the surface plated layer 2 and stops there as shown in FIG. 2, so that the crack does not penetrate very deeply into the insulating layer 7. Therefore, the problem in that the performance of the wiring board is degraded is avoided.

In the present invention, the term "external circuit" means a circuit which is outside the wiring board, and to which the wiring board is to be connected. For example, "external circuit" in the present invention is a circuit of a semiconductor chip or another electronic component which is to be mounted on the wiring board, that of a mounting board to which a wiring board on which such a semiconductor chip and the like are mounted is to be connected, or the like.

The materials of the members constituting the wiring board of the present invention may be similar to those of equivalent members in a usual wiring board. As the material of the external connection pad, for example, a usual wiring material such as copper (Cu) or a copper alloy may be used. As the material of the surface plated layer disposed on the external connection pad, (1) a combination of Ni and Au, (2) a combination of Ni, Pd, and Au, (3) Sn, (4) a combination of Sn and Ag, or the like may be used. In the case of the combination of (1), (2), or (4), plated layers are sequentially stacked so that the Au layer or the Ag layer is exposed to the outside.

The wiring board of the present invention can be produced by a method in which external connection pads are first formed together with surface plated layers on a support member made of a metal such as a copper plate or a copper foil, required numbers of insulating layers and wiring layers are formed on the external connection pads by a build-up technique, external connection pads are formed on the opposite side are formed, and thereafter the support member is removed. A process of retracting the outer peripheral edge of each of the external connection pads of one face of the wiring board from that of the surface plated layer toward the center of the pad can be performed before the initial formation of the surface plated layer by a build-up technique.

In the thus produced wiring board of the present invention, the external connection pads which are initially formed on the support member are pads in each of which the outer peripheral edge is retracted from that of the surface plated layer toward the center of the pad, and by contrast the external connection pads on the opposite side (the final pads formed by the build-up technique) are larger than the surface plated layer. Mainly, the former pads are used for mounting a semiconductor chip or another electronic component on the wiring board, and the latter pads are used for mounting the wiring board on a mounting board. In some cases, nevertheless, the pads may be used in the opposite manner.

EXAMPLES

Next, the present invention will be further described by way of examples. However, the present invention is not restricted to the examples described below.

Example 1

In Example 1, a wiring board in which the surface of a surface plated layer and that of a wiring board are in the same plane will be described together with a method producing it.

Figure 3A:
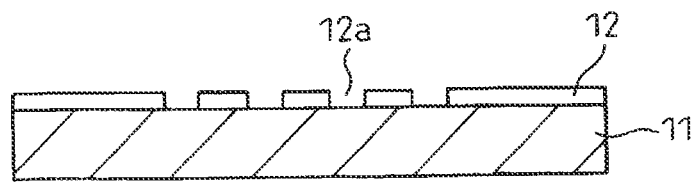
FIGS. 3A to 3E are first views illustrating the production of a wiring board of Example 1.
Figure 3B:
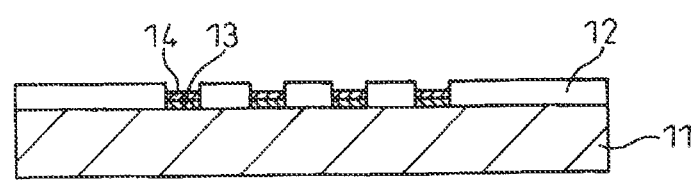

As shown in FIG. 3A, a plate resist pattern 12 which will be used as a mask pattern is formed on the surface of a Cu plate serving as a support member 11. In FIG. 3A, for the sake of simplicity, only the resist pattern 12 on one face of the support member 11 is shown. Actually, also the opposite face of the support member 11 is covered by a plate resist pattern. As the support member 11, other than a Cu plate, a Cu foil or a plate or foil of another metal or alloy which can be removed by a usual etchant may be used. As shown in FIG. 3B, surface plated layers 13 and external connection pads 14 are sequentially formed by electrolytic plating on the support member 11 which is exposed in bottom portions of opening portions 12a (FIG. 3A) (having a diameter of 100 μm) of the plate resist pattern 12. The electrolytic plating is performed by feeding power from the support member 11. Here, each thickness of the external connection pads 14 is greater than each thickness of the surface plated layers 13. Each of the surface plated layers 13 is formed by an Au layer and Ni layer respectively having thicknesses of 0.5 μm and 5 μm (the Au layer and the Ni layer are formed in this sequence). The external connection pads 14 are formed by Cu so as to have a thickness of 10 μm.

Figure 3C:
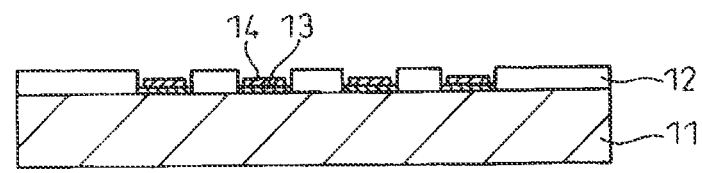
Figure 3D:
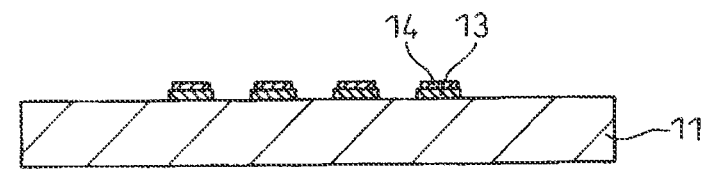
Figure 3E:
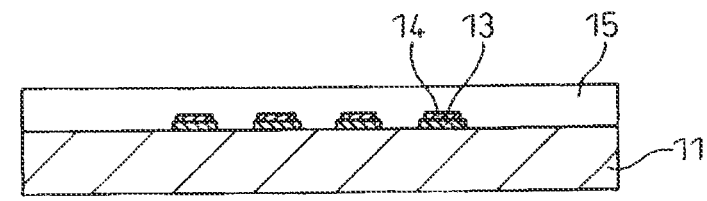

Next, while using an etchant which dissolves only Cu, the external connection pads 14 are selectively etched so that the outer peripheral edges of the external connection pads 14 are made smaller by about 1 to 3 μm than the outer peripheral edges of the surface plated layers 13 (FIG. 3C). After etching, the plate resist pattern 12 is removed (FIG. 3D), and then a resin film is laminated over the whole face so as to cover the pads 14, thereby forming an insulating layer 15 (FIG. 3E). As the resin film, a film of epoxy, polyimide, or the like may be used.

Figure 4A:
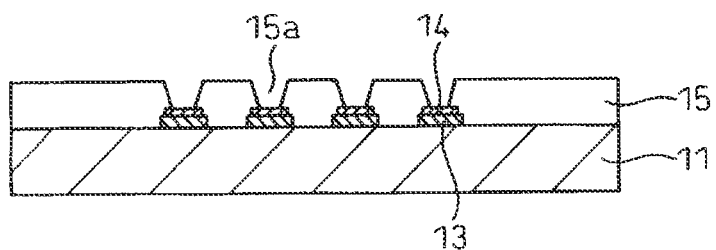
FIGS. 4A to 4D are second views illustrating the production of the wiring board of Example 1.
Figure 4B:
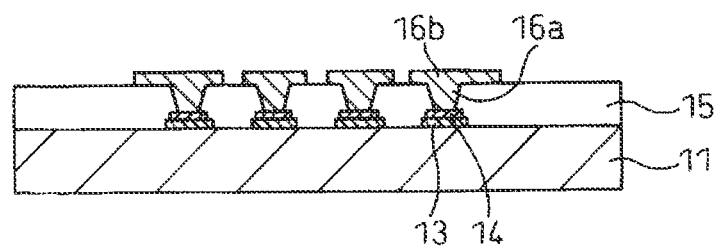

As shown in FIG. 4A, next, via holes 15a are formed in the insulating layer 15 by laser processing. The diameter of each of the via holes 15a is 60 μm in the surface of the insulating layer 15, and about 50 μm in the bottom portion from which the pad 14 is exposed, so that the via hole 15a is formed into a circular truncated cone-like shape in which the opening portion side has a larger diameter. Then, vias 16a connected to the pads 14, and a wiring pattern for a wiring layer 16b connected to the vias 16a are formed (FIG. 4B). For example, the wiring layer 16b is formed by copper. In this process, for example, a usual method such as the semi-additive method can be used.

Figure 4C:
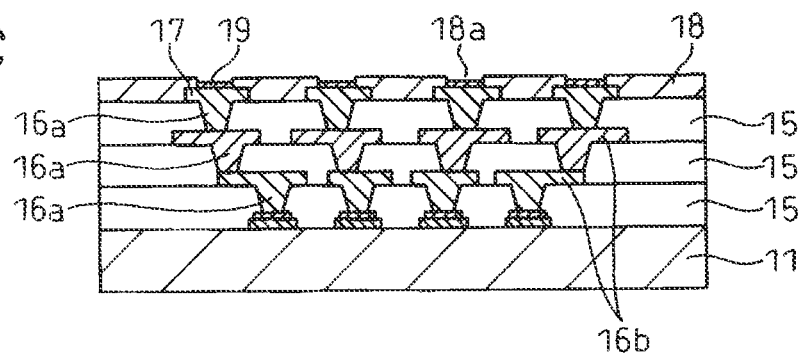
Figure 4D:
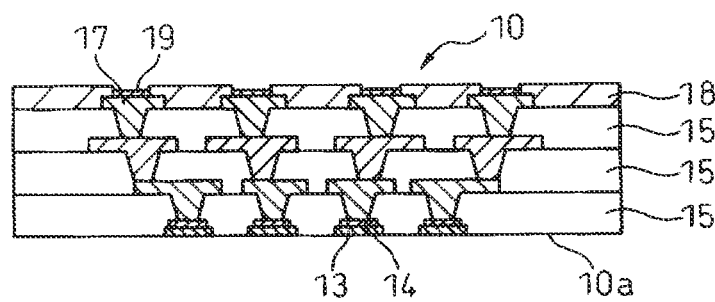

The formation of an insulating layer, and that of vias and a wiring layer are repeated to form predetermined numbers of insulating layers 15 and wiring layers 16b as shown in FIG. 4C, and the external connection pads 17 (having a diameter of 200 to 1,000 μm) are formed together with a wiring pattern on the uppermost insulating layer 15. Then, a solder resist layer 18 having opening portions 18a which are connected to the pads 17 is formed. Furthermore, surface plated layers 19 are formed by electroless plating on the pads 17 which are exposed in the opening portions 18a. In the surface plated layers 19, for example, a Ni layer and an Au later are formed in this order. Other words, the surface plated layers 19 are formed of the Ni layer and the Au layer so as to expose the Au layer externally. Thereafter, the support member 11 is removed by etching, thereby completing a wiring board 10 as shown in FIG. 4D. In the completed wiring board 10, the pads 14 in the face 10a from which the support member 11 is removed are used as pads for connecting with a semiconductor chip or the like, and the pads 17 in the opposite face are used as pads for connecting with a mounting board.

Figure 5:
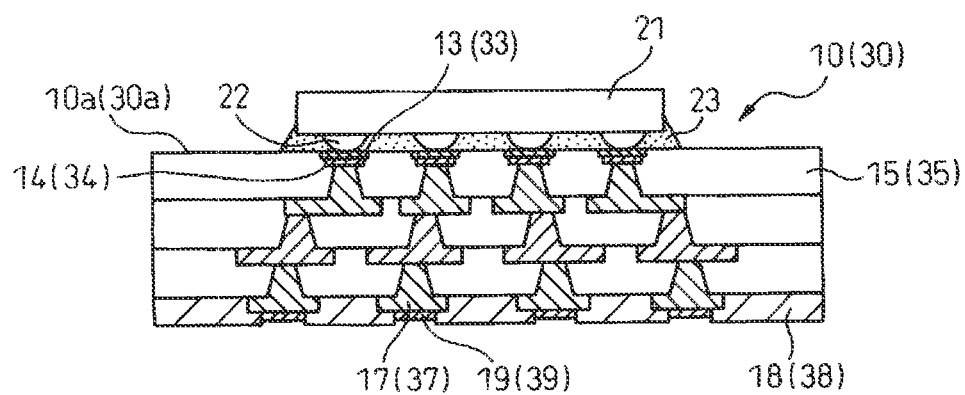
FIG. 5 is a view showing a wiring board of Examples 1 and 2 on which a semiconductor chip is mounted.

FIG. 5 shows the wiring board 10 on which a semiconductor chip 21 is mounted. The semiconductor chip 21 is connected to the pads 14 of the wiring board 10 by solder joining members 22 which are formed by reflowing bumps that are previously disposed on the semiconductor chip 21. The gap between the wiring board 10 and the semiconductor chip 21 is filled with an underfill resin 23.

Figure 6:
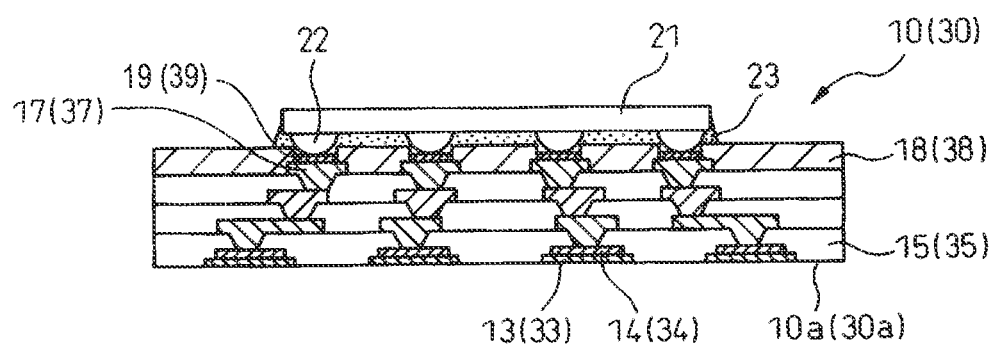
FIG. 6 is a view showing the wiring board of Examples 1 and 2 in which a semiconductor chip is mounted on a face opposite to the case of the wiring board of FIG. 5.

As shown in FIG. 6, the semiconductor chip 21 may be connected to the pads 17 in the face opposite to the face 10a of the wiring board 10 from which the support member 11 is removed. In this case, the pads 14 in the face 10a of the wiring board 10 from which the support member 11 is removed are used as pads for connecting a mounting board (not shown).

Example 2

Hereinafter, a wiring board in which the surface of a surface plated layer and that of a wiring board are in the same plane will be described together with another method producing it.

Figure 7A:
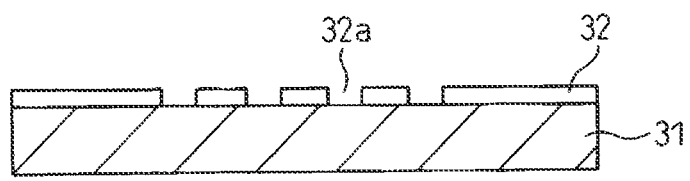
FIGS. 7A to 7D are first views illustrating the production of the wiring board of Example 2.
Figure 7B:
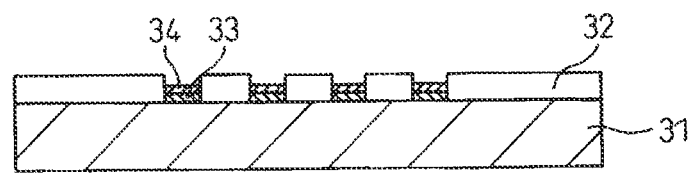

As shown in FIG. 7A, a plate resist pattern 32 is formed on the surface of a Cu plate serving as a support member 31 (a resist layer (not shown) is formed also on the rear face of the support member 31). As the support member 31, other than a Cu plate, a Cu foil or a plate or foil of another metal or alloy which can be removed by a usual etchant may be used. As shown in FIG. 7B, surface plated layers 33 and external connection pads 34 are sequentially formed by electrolytic plating on the support member 31 which is exposed in bottom portions of opening portions 32a (FIG. 7A) (having a diameter of 100 μm) of the plate resist pattern 32. As each of the surface plated layers 33, an Au layer and Ni layer respectively having thicknesses of 0.5 μm and 5 μm are formed in this sequence. The external connection pads 34 are formed by Ni so as to have a thickness of 10 μm.

Figure 7C:
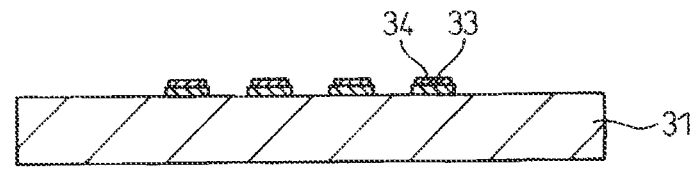
Figure 7D:
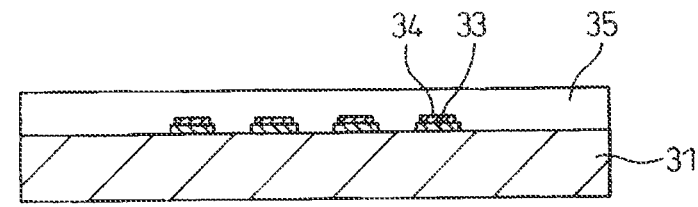

Next, the plate resist pattern 32 is peeled off, and then the external connection pads 34 made of Ni are selectively etched so that the outer peripheral edges of the external connection pads 34 are made smaller by about 1 to 3 μm than the outer peripheral edges of the plated layers 33 (FIG. 7C). As shown in FIG. 7D, thereafter, a resin film is laminated over the whole face so as to cover the external connection pads 34, thereby forming an insulating layer 35. In the formation of the insulating layer 35, a resin film of epoxy, polyimide, or the like may be used.

Figure 8A:
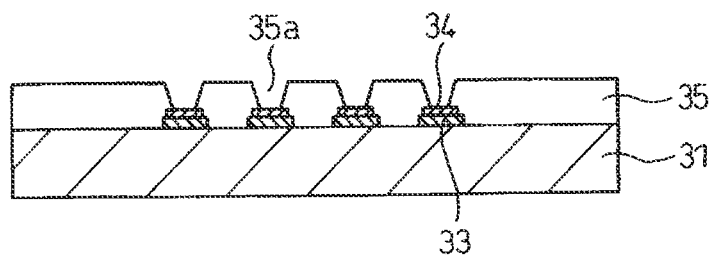
FIGS. 8A to 8D are second views illustrating the production of the wiring board of Example 2.
Figure 8B:
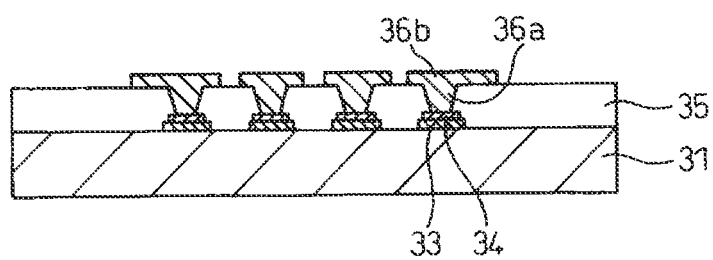

As shown in FIG. 8A, next, via holes 35a are formed in the insulating layer 35 by laser processing. The diameter of each of the via holes 35a is 60 μm in the surface of the insulating layer 35, and about 50 μm in the bottom portion from which the pad 34 is exposed. Then, vias 36a connected to the pads 34, and a wiring layer 36b connected to the vias are formed by, for example, the semi-additive method (FIG. 8B).

Figure 8C:
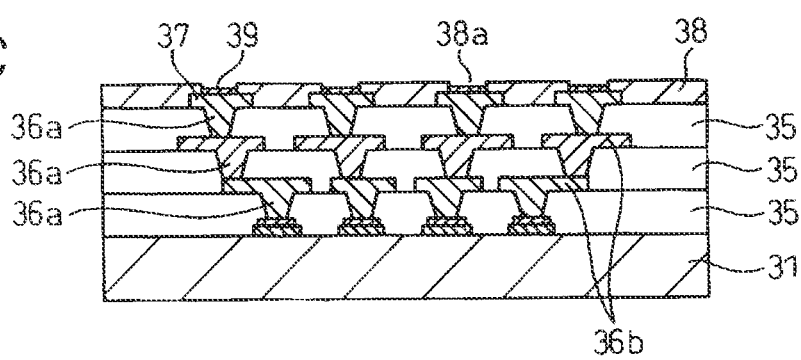
Figure 8D:
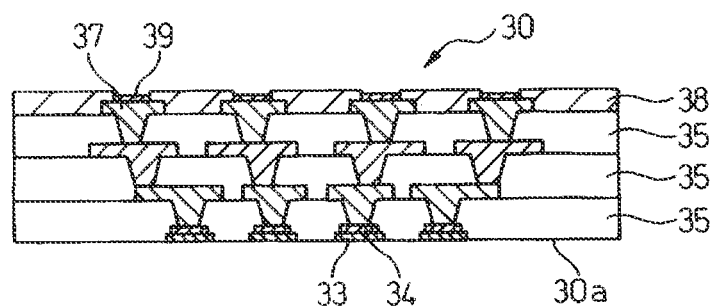

Then, the formation of an insulating layer, and that of vias and a wiring layer are repeated to form predetermined numbers of insulating layers 35 and wiring layers 36b as shown in FIG. 8C, and external connection pads 37 (having a diameter of 200 to 1,000 μm) are formed together with a wiring pattern on the uppermost insulating layer 35. Then, a solder resist layer 38 having opening portions 38a which are connected to the pads 37 is formed. Furthermore, surface plated layers 39 are formed by electroless plating on the pads 37 which are exposed in the opening portions 38a. Thereafter, the support member 31 is removed by etching, thereby completing a wiring board 30 as shown in FIG. 8D. In the completed wiring board 30, the pads 34 in the face 30a from which the support member 31 is removed are used as pads for connecting with a semiconductor chip or the like, and the pads 37 in the opposite face are used as pads for connecting with a mounting board. In this case, the configuration where a semiconductor chip is connected to the wiring board 30 is identical with that in the case of the wiring board 10 of Example 1, or as exemplarily shown in FIG. 5.

Similarly with the case of the wiring board 10 of Example 1, also in the wiring board 30 of Example 2, the semiconductor chip may be connected to the pad 37 in the face of the wiring board 30 opposite to the face 30a from which the support member 31 is removed. In this case, as shown in FIG. 6, the pads 34 in the face 30a of the wiring board 30 from which the support member 31 is removed are used as pads for connecting a mounting board (not shown).

Example 3

Hereinafter, an example of a wiring board in which a surface plated layer is positioned in a recess of the wiring board will be described together with a method producing it. The materials and dimensions of the members, the processing methods, and the like used in the following examples are identical with those described in Examples 1 and 2, unless otherwise specified.

Figure 9A:
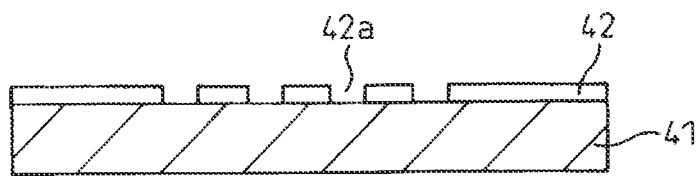
FIGS. 9A to 9E are first views illustrating the production of a wiring board of Example 3.
Figure 9B:
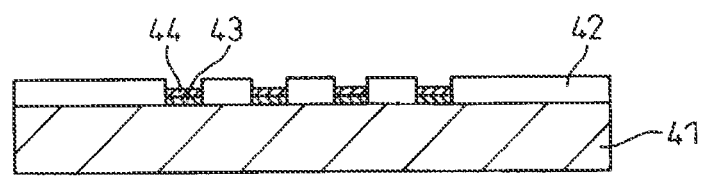

As shown in FIG. 9A, a plate resist pattern 42 having opening portions 42a is formed on the surface of a Cu plate serving as a support member 41 (a resist layer (not shown) is formed also on the rear face of the support member 41). As shown in FIG. 9B, surface plated layers 43 (formed by an Au layer and a Ni layer) and external connection pads 44 made of Cu are sequentially formed by electrolytic plating on the support member 41 which is exposed in bottom portions of opening portions 42a.

Figure 9C:
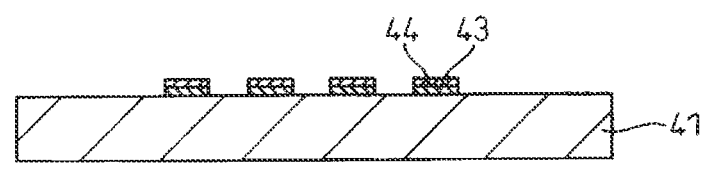
Figure 9D:
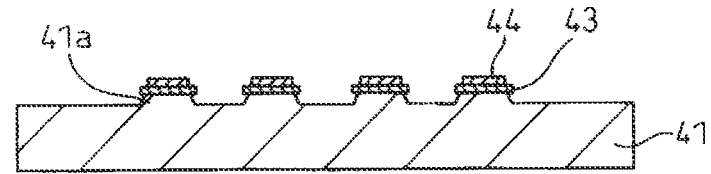
Figure 9E:
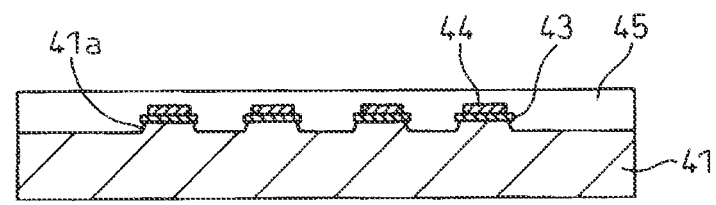

After the plate resist pattern 42 is removed (FIG. 9C), the Cu material is selectively etched so that, as shown in FIG. 9D, the outer peripheral edges of the pads 44 are made smaller by about 1 to 3 μm than the outer peripheral edges of the surface plated layers 43, and a part of the support member 41 made of the Cu material is dissolved away by side etching and undercut due to the mask effect of the surface plated layers 43, so that peripheral edge portions of the surface plated layers 43 on the side contacted with the support member 41 are exposed. Therefore, projections 41a having a height of about 1 to 3 μm are formed on the support member 41, and the surface plated layers 43 and the pads 44 are placed on the projections 41a. After the etching, a resin film is laminated over the whole face so as to cover the pads 44, thereby forming an insulating layer 45 (FIG. 9E).

Figure 10A:
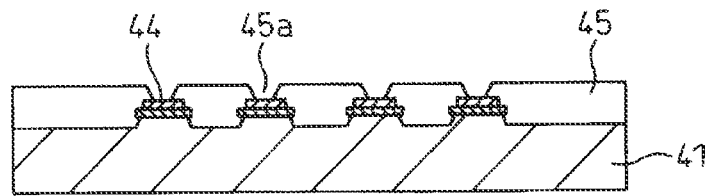
FIGS. 10A to 10D are second views illustrating the production of the wiring board of Example 3.
Figure 10B:
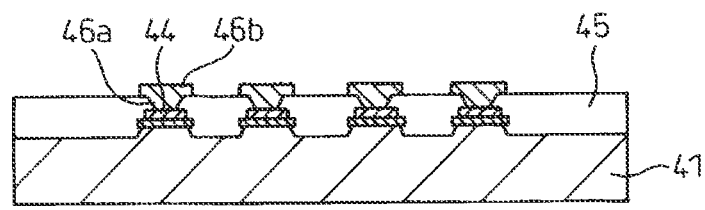

As shown in FIG. 10A, next, via holes 45a are formed in the insulating layer 45 by laser processing. As shown in FIG. 10B, thereafter, vias 46a connected to the pads 44, and a wiring pattern for a wiring layer 46b connected to the vias 46a are formed.

Figure 10C:
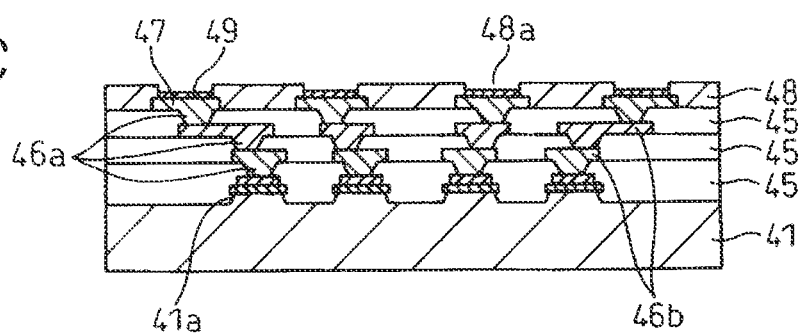
Figure 10D:
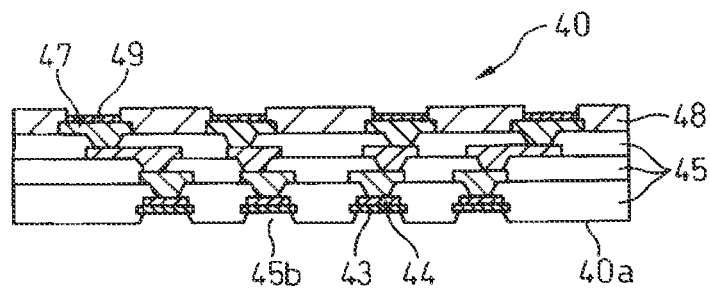

The formation of an insulating layer, and that of vias and a wiring layer are repeated to form predetermined numbers of insulating layers 45 and wiring layers 46b as shown in FIG. 10C, external connection pads 47 are formed together with a wiring pattern on the uppermost insulating layer 45, and thereafter a solder resist layer 48 having opening portions 48a which are connected to the pads 47 is formed. Next, surface plated layers 49 are formed by electroless plating on the pads 47 which are exposed in the opening portions 48a. Thereafter, the support member 41 is removed together with the projections 41a by etching, thereby completing a wiring board 40 as shown in FIG. 10D. In the completed wiring board 40, the pads 44 in the face 40a from which the support member 41 is removed are used as pads for connecting with a semiconductor chip or the like, and the pads 47 in the opposite face are used as pads for connecting with a mounting board.

In the wiring board 40 of Example 3, by the removal of the support member 41 by etching, recesses 45b in which the opening portions on the side of the face 40a have a larger diameter in conforming to the shape of the projections 41a of the support member 41 are formed in the insulating layer 45 which has been contacted with the support member 41.

Because of the recesses 45b, in the case where a semiconductor chip is flip chip connected to the wiring board 40, when bumps of the semiconductor chip are positioned in the recesses 45b, the bumps can be easily connected to the wiring board, and the positioning of the chip can be facilitated. Moreover, the peripheral edge portions of the surface plated layers 43 are covered by the insulating layer 45, and hence the adhesion strength of the surface plated layers 43 to the wiring board 40 is improved.

Figure 11:
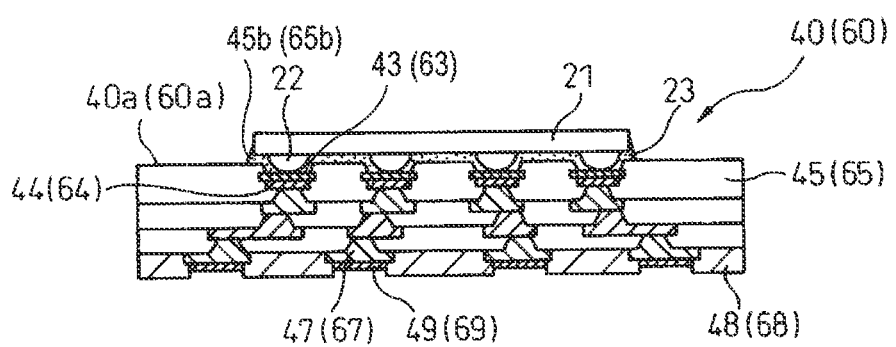
FIG. 11 is a view showing a wiring board of Examples 3 and 5 on which a semiconductor chip is mounted.

FIG. 11 shows the wiring board 40 on which the semiconductor chip 21 is mounted. The semiconductor chip 21 is connected to the pads 44 positioned in the recesses 45b (FIG. 10D) of the wiring board 40, by the solder joining members 22 which are formed by reflowing bumps that are previously disposed on the semiconductor chip 21. The gap between the wiring board 40 and the semiconductor chip 21 is filled with the underfill resin 23.

Figure 12:
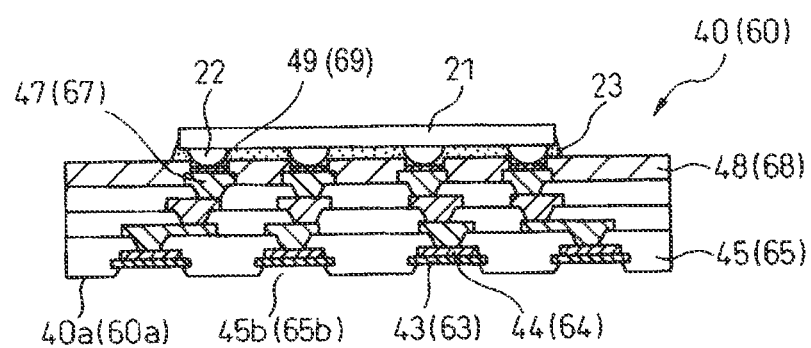
FIG. 12 is a view showing the wiring board of Examples 3 and 5 in which a semiconductor chip is mounted on a face opposite to the case of the wiring board of FIG. 11.

As shown in FIG. 12, the semiconductor chip 21 may be connected to the pads 47 in the face opposite to the face 40a of the wiring board 40 from which the support member 41 is removed. In this case, the pads 44 in the face 40a of the wiring board 40 from which the support member 41 is removed are used as pads for connecting a mounting board (not shown).

Example 4

Hereinafter, another example of a wiring board in which a surface plated layer is positioned in a recess of the wiring board will be described together with a method producing it.

Figure 13A:
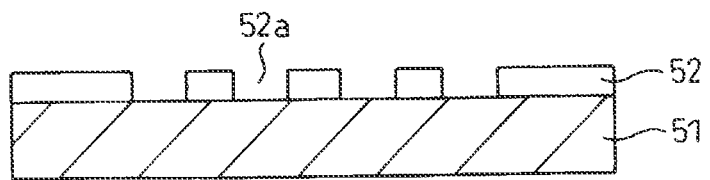
FIGS. 13A to 13F are first views illustrating the production of a wiring board of Example 4.
Figure 13B:
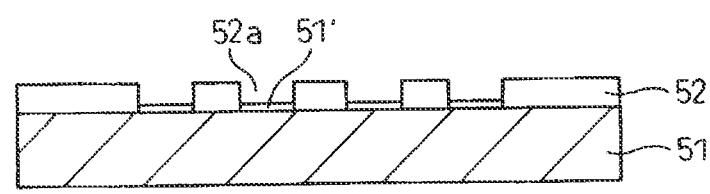
Figure 13C:
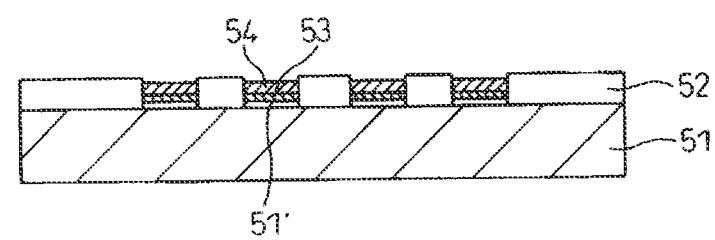

As shown in FIG. 13A, a plate resist pattern 52 having opening portions 52a is formed on the surface of a Cu plate serving as a support member 51 (a resist layer (not shown) is formed also on the rear face of the support member 51). Sacrificial layers 51' (having a thickness of 1 to 30 μm) which are made of Cu of the same material as the support member 51 are formed by electrolytic plating on the support member 51 which is exposed in bottom portions of opening portions 52a (FIG. 13B). When the support member 51 is removed later, also the sacrificial layers 51' are removed together with the support member 51. Therefore, the sacrificial layers 51' are preferably made of the same material as the support member 51. As shown in FIG. 13C, thereafter, surface plated layers 53 (formed by an Au layer and a Ni layer) and external connection pads 54 made of Cu are formed similarly by electrolytic plating in a sequential manner.

Figure 13D:
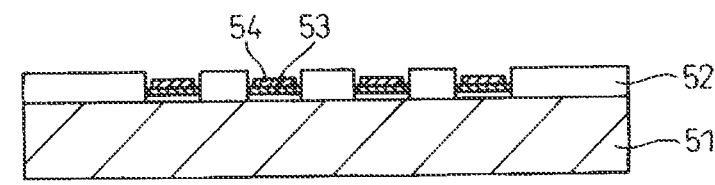
Figure 13E:
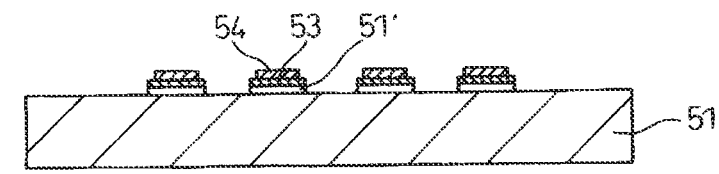
Figure 13F:
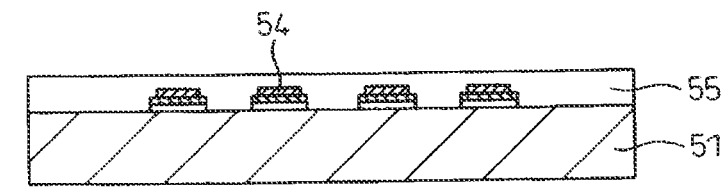

Next, the outer peripheral edges of the pads 54 are made smaller by about 1 to 3 μm than the outer peripheral edges of the surface plated layers 53 as shown in FIG. 13D, by selective etching of Cu, and then the plate resist pattern 52 is removed (FIG. 13E). Thereafter, a resin film is laminated over the whole face so as to cover the pads 54, thereby forming an insulating layer 55 (FIG. 13F).

Figure 14A:
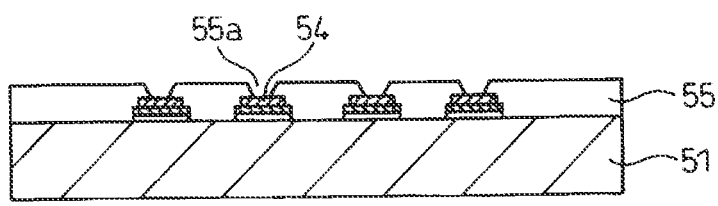
FIGS. 14A to 14D are second views illustrating a production of the wiring board of Example 4.
Figure 14B:
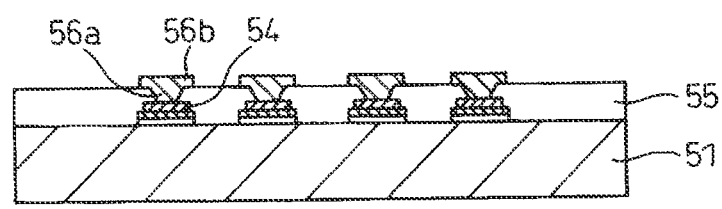

As shown in FIG. 14A, next, via holes 55a are formed in the insulating layer 55 by laser processing. As shown in FIG. 14B, thereafter, vias 56a connected to the pads 54, and a wiring pattern for a wiring layer 56b connected to the vias 56a are formed.

Figure 14C:
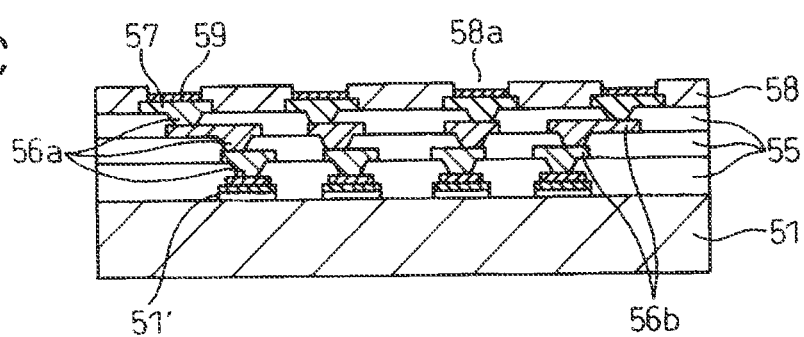
Figure 14D:
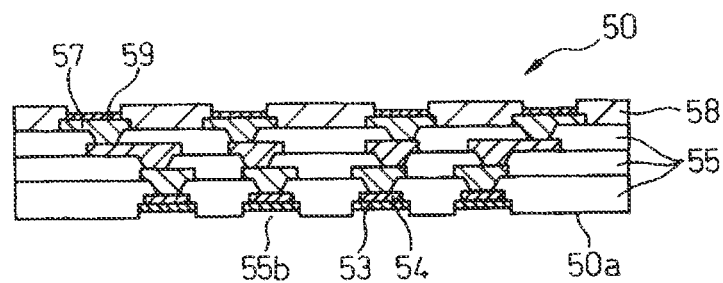

The formation of an insulating layer, and that of vias and a wiring layer are repeated to form predetermined numbers of insulating layers 55 and wiring layers 56b as shown in FIG. 14C, external connection pads 57 are formed together with a wiring pattern on the uppermost insulating layer 55, and thereafter a solder resist layer 58 having opening portions 58a which are connected to the pads 57 is formed. Next, surface plated layers 59 are formed by electroless plating on the pads 57 which are exposed in the opening portions 58a. Thereafter, the support member 51 is removed together with the sacrificial layers 51' by etching, thereby completing a wiring board 50 as shown in FIG. 14D. In the completed wiring board 50, the pads 54 in the face 50a from which the support member 51 is removed are used as pads for connecting with a semiconductor chip or the like, and the pads 57 in the opposite face are used as pads for connecting with a mounting board.

In the wiring board 50 of Example 4, by the removal of the support member 51 by etching, recesses 55b in which the opening portions on the side of the face 50a have a larger diameter in conforming to the shape of the sacrificial layers 51' are formed in the insulating layer 55 which has been contacted with the support member 51. Because of the recesses 55b, in the case where a semiconductor chip is flip chip connected to the wiring board, when bumps of the semiconductor chip are positioned in the recesses 55b, the bumps can be easily connected to the wiring board, and the positioning of the chip can be facilitated.

Figure 15:
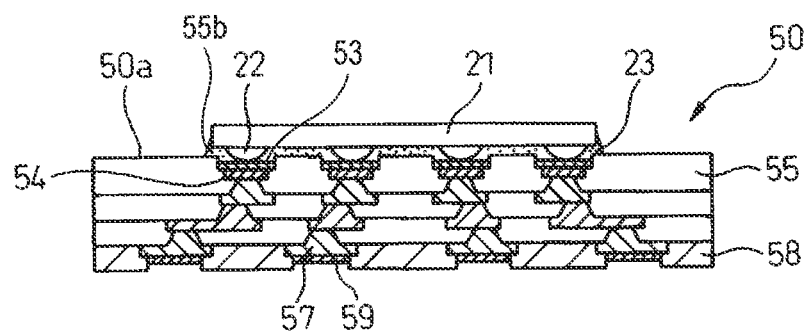
FIG. 15 is a view showing the wiring board of Example 4 on which a semiconductor chip is mounted.

FIG. 15 shows the wiring board 50 on which the semiconductor chip 21 is mounted. The semiconductor chip 21 is connected to the pads 54 positioned in the recesses 55b (FIG. 14D) of the wiring board 50, by the solder joining members 22 which are formed by reflowing bumps that are previously disposed on the semiconductor chip 21. The gap between the wiring board 50 and the semiconductor chip 21 is filled with the underfill resin 23.

Figure 16:
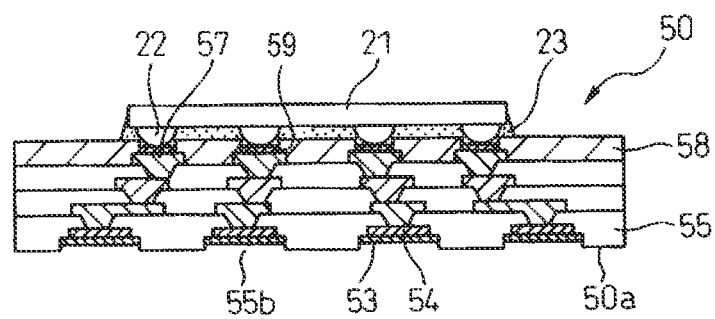
FIG. 16 is a view showing the wiring board of Example 4 in which a semiconductor chip is mounted on a face opposite to the case of the wiring board of FIG. 15.

As shown in FIG. 16, the semiconductor chip 21 may be connected to the pads 57 in the face opposite to the face 50a of the wiring board 50 from which the support member 51 is removed. In this case, the pads 54 in the face 50a of the wiring board 50 from which the support member 51 is removed are used as pads for connecting a mounting board (not shown).

Example 5

Hereinafter, a further example of a wiring board in which a surface plated layer is positioned in a recess of the wiring board will be described together with a method producing it.

Figure 17A:
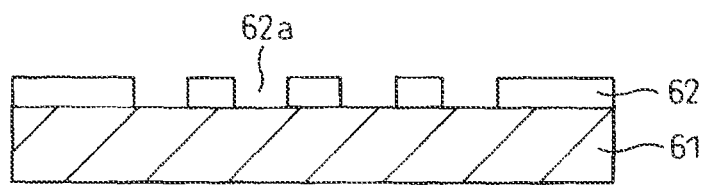
FIGS. 17A to 17F are first views illustrating a production of the wiring board of Example 5.
Figure 17B:
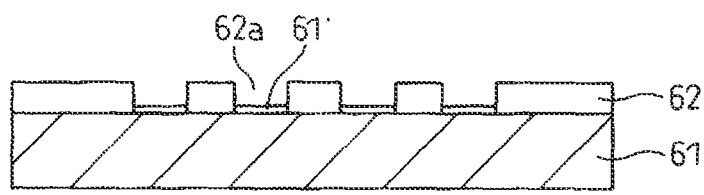
Figure 17C:
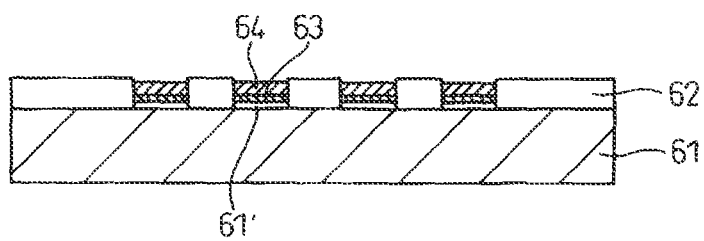

As shown in FIG. 17A, a plate resist pattern 62 having opening portions 62a is formed on the surface of a Cu plate serving as a support member 61 (a resist layer (not shown) is formed also on the rear face of the support member 61). Sacrificial layers 61' (having a thickness of 1 to 30 μm) which are made of Cu of the same material as the support member 61 are formed by electrolytic plating on the support member 61 which is exposed in bottom portions of opening portions 62a (FIG. 17B). As shown in FIG. 17C, thereafter, surface plated layers 63 (formed by an Au layer and a Ni layer) and external connection pads 64 made of Cu are formed similarly by electrolytic plating in a sequential manner.

Figure 17D:
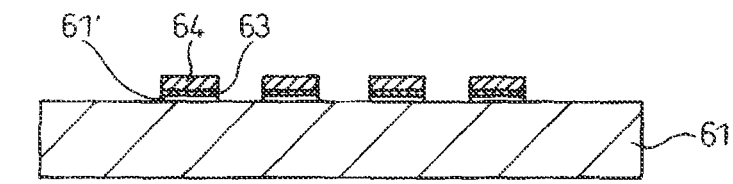
Figure 17E:
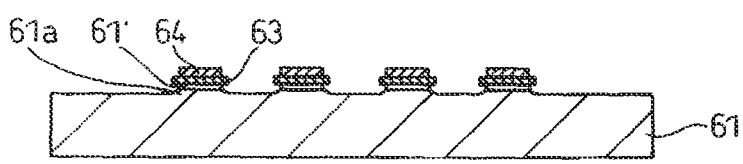
Figure 17F:
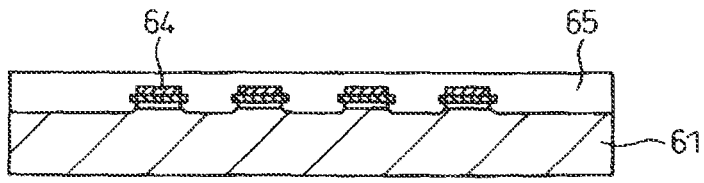

After the plate resist pattern 62 is removed (FIG. 17D), the Cu material is selectively etched so that, as shown in FIG. 17E, the outer peripheral edges of the pads 64 are made smaller by about 1 to 3 μm than the outer peripheral edges of the surface plated layers 63, and a part of the support member 61 made of the Cu material, and a part of the sacrificial layers 61' are dissolved away by side etching and undercut due to the mask effect of the surface plated layers 63, so that peripheral edge portions of the surface plated layers 63 on the side contacted with the support member 61 are exposed. Therefore, projections 61a having a height of about 1 to 3 μm are formed on the support member 61, and the sacrificial layers 61', the surface plated layers 63, and the pads 64 are placed on the projections 61a. After the etching, a resin film is laminated over the whole face so as to cover the pads 64, thereby forming an insulating layer 65 (FIG. 17F).

Figure 18A:
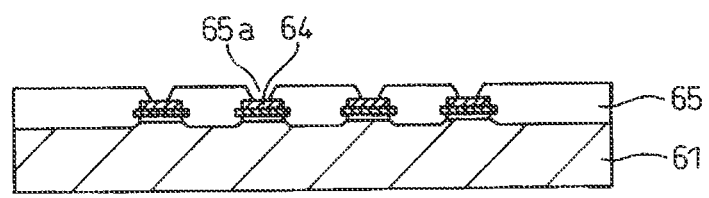
FIGS. 18A to 18D are second views illustrating a production of the wiring board of Example 5.
Figure 18B:
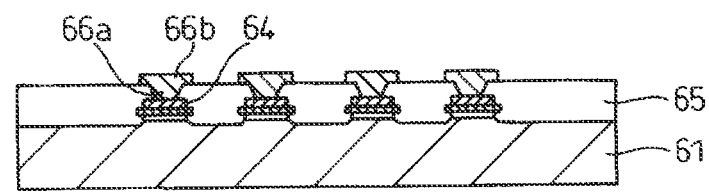

As shown in FIG. 18A, next, via holes 65a are formed in the insulating layer 65 by laser processing. As shown in FIG.

18B, thereafter, vias 66a connected to the pads 64, and a wiring pattern for a wiring layer 66b connected to the vias 66a are formed.

Figure 18C:
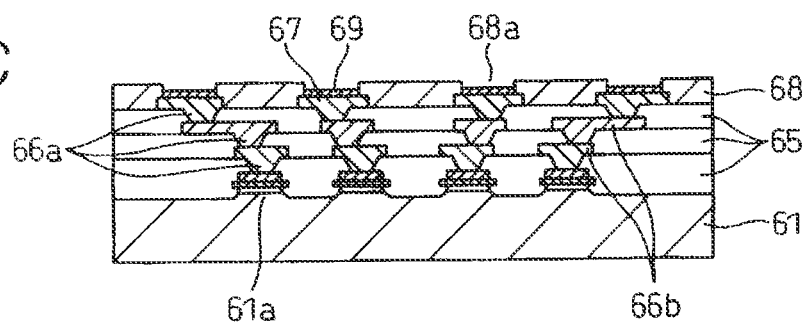
Figure 18D:
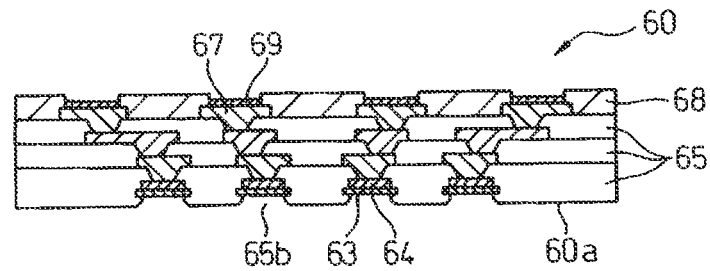

The formation of an insulating layer, and that of vias and a wiring layer are repeated to form predetermined numbers of insulating layers 65 and wiring layers 66b as shown in FIG. 18C, external connection pads 67 are formed together with a wiring pattern on the uppermost insulating layer 65, and thereafter a solder resist layer 68 having opening portions 68a which are connected to the pads 67 is formed. Next, surface plated layers 69 are formed by electroless plating on the pads 67 which are exposed in the opening portions 68a. Thereafter, the support member 61 is removed together with the projections 61a and the sacrificial layers 61' by etching, thereby completing a wiring board 60 as shown in FIG. 18D. In the completed wiring board 60, the pads 64 in the face 60a from which the support member 61 is removed are used as pads for connecting with a semiconductor chip or the like, and the pads 67 in the opposite face are used as pads for connecting with a mounting board.

In the wiring board 60 of Example 5, by the removal of the support member 61 by etching, recesses 65b which conform to the shapes of the projections 61a of the support member 61 and the sacrificial layers 61' are formed in the insulating layer 65 which has been contacted with the support member 61. Because of the recesses 65b, in the case where a semiconductor chip is flip chip connected to the wiring board 60, when bumps of the semiconductor chip are positioned in the recesses 65b, the bumps can be easily connected to the wiring board, and the positioning of the chip can be facilitated. Since also the sacrificial layers 61' is removed in the formation of the recesses 65b by etching, deeper recesses can be formed. Moreover, the peripheral edge portions of the surface plated layers 63 are covered by the insulating layer 65, and hence the adhesion strength of the surface plated layers 63 to the wiring board 60 is improved.

The configuration of Example 5 where a semiconductor chip is connected to the wiring board 60 is basically identical with that in the case of the wiring board 40 of Example 3, or as exemplarily shown in FIG. 11. Similarly with the case of the wiring board 40 of Example 3, also in the case of the wiring board 60 of Example 5, the semiconductor chip may be connected to the pads 67 in the face opposite to the face 60a of the wiring board 60 from which the support member 61 is removed. In this case, as shown in FIG. 12, the pads 64 in the face 60a of the wiring board 60 from which the support member 61 is removed are used as pads for connecting a mounting board (not shown).

Example 6

Hereinafter, an example of a wiring board in which a surface plated layer is projected from the surface of the wiring board will be described together with a method producing it.

Figure 19A:
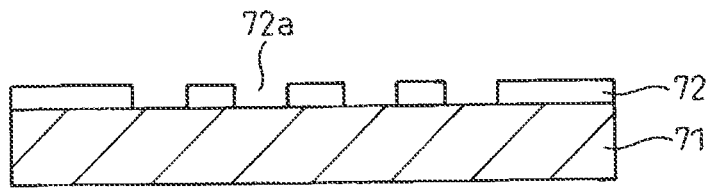
FIGS. 19A to 19F are first views illustrating a production of a wiring board of Example 6.
Figure 19B:
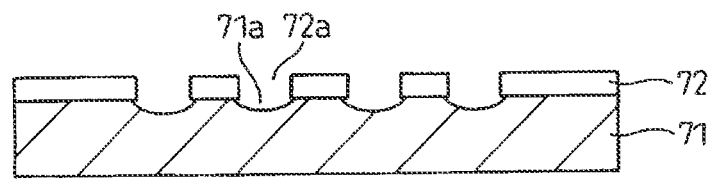
Figure 19C:
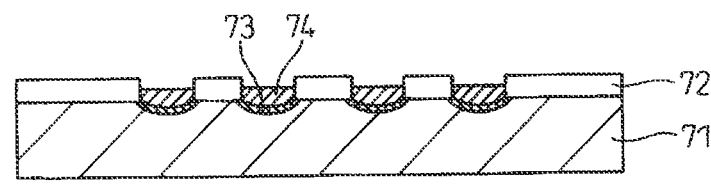

As shown in FIG. 19A, a plate resist pattern 72 having opening portions 72a is formed on the surface of a Cu plate serving as a support member 71 (a resist layer (not shown) is formed also on the rear face of the support member 71). The support member 71 is etched while using the resist pattern 72 as a mask, to form semispherical recesses 71a in the support member 71 (FIG. 19B). As shown in FIG. 19C, then, surface plated layers 73 (formed by an Au layer and a Ni layer) and external connection pads 74 made of Cu are sequentially formed by electrolytic plating in the recesses 71a.

Figure 19D:
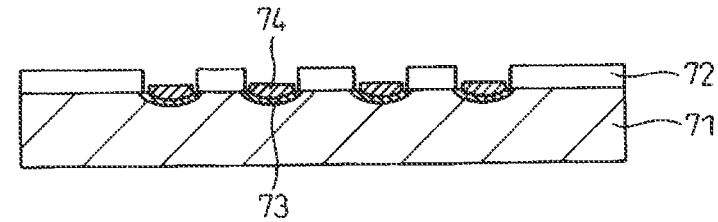
Figure 19E:
Figure 19F:
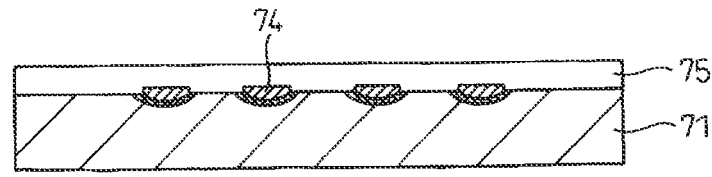

Next, the outer peripheral edges of the pads 74 are made smaller by about 1 to 3 μm than the outer peripheral edges of the surface plated layers 73 as shown in FIG. 19D, by selective etching of Cu, and then the plate resist pattern 72 is removed (FIG. 19E). Thereafter, a resin film is laminated over the whole face so as to cover the pads 74, thereby forming an insulating layer 75 (FIG. 19F).

Figure 20A:
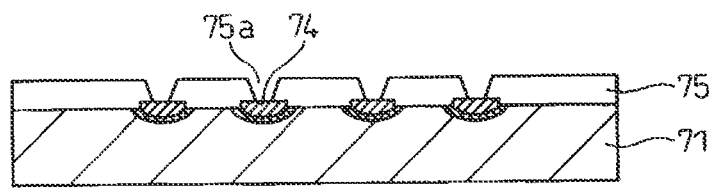
FIGS. 20A to 20D are second views illustrating a production of the wiring board of Example 6.
Figure 20B:
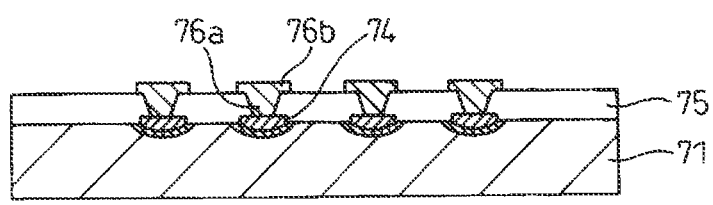

As shown in FIG. 20A, next, via holes 75a are formed in the insulating layer 75 by laser processing. As shown in FIG. 20B, thereafter, vias 76a connected to the pads 74, and a wiring pattern for a wiring layer 76b connected to the vias 76a are formed.

Figure 20C:
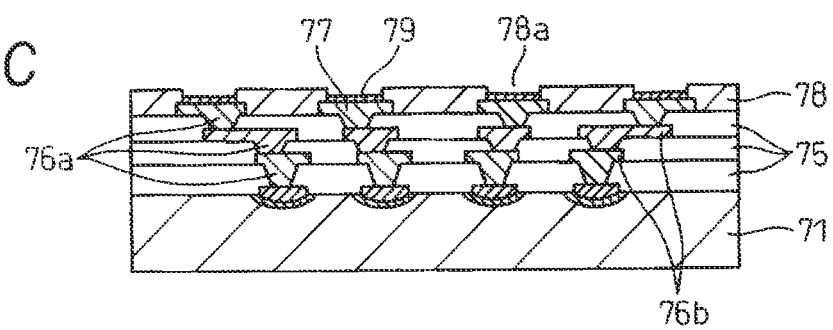
Figure 20D:
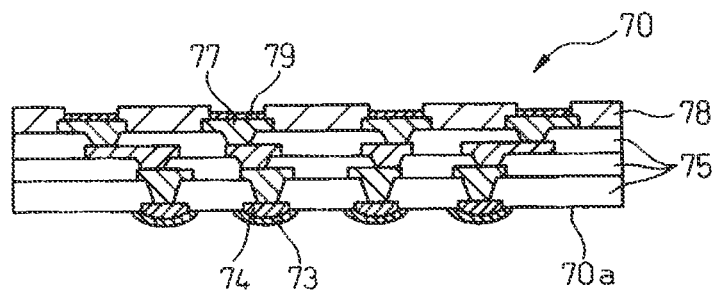

The formation of an insulating layer, and that of vias and a wiring layer are repeated to form predetermined numbers of insulating layers 75 and wiring layers 76b as shown in FIG. 20C, external connection pads 77 are formed together with a wiring pattern on the uppermost insulating layer 75, and thereafter a solder resist layer 78 having opening portions 78a which are connected to the pads 77 is formed. Next, surface plated layers 79 are formed by electroless plating on the pads 77 which are exposed in the opening portions 78a. Thereafter, the support member 71 is removed by etching, thereby completing a wiring board 70 as shown in FIG. 20D. In the completed wiring board 70, the pads 74 in the face 70a from which the support member 71 is removed are used as pads for connecting with a semiconductor chip or the like, and the pads 77 in the opposite face are used as pads for connecting with a mounting board.

Figure 21:
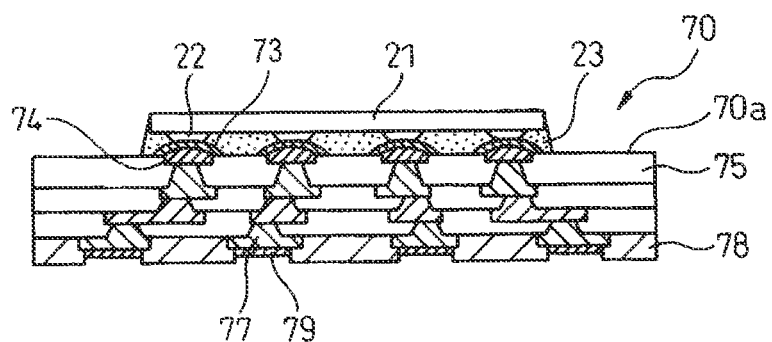
FIG. 21 is a view showing the wiring board of Example 6 on which a semiconductor chip is mounted.

FIG. 21 shows the wiring board 70 on which the semiconductor chip 21 is mounted. The semiconductor chip 21 is connected to the pads 74 of the wiring board 70, by the solder joining members 22 which are formed by reflowing bumps that are previously disposed on the semiconductor chip 21. Since the pads 74 are projected, the connection can be suitably performed even when the solder joining members 22 are fine and have a small diameter. The gap between the wiring board 70 and the semiconductor chip 21 is filled with the underfill resin 23.

Figure 22:
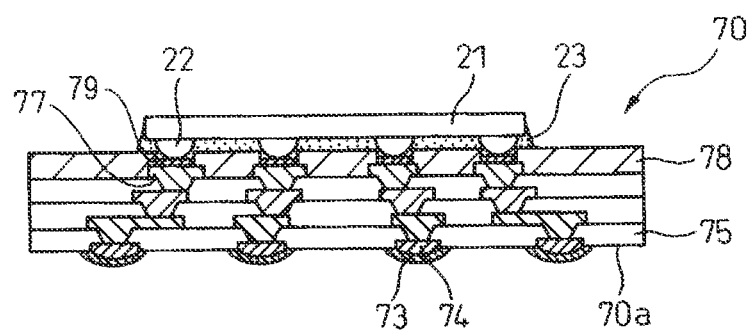
FIG. 22 is a view showing the wiring board of Example 6 in which a semiconductor chip is mounted on a face opposite to the case of the wiring board of FIG. 21.

As shown in FIG. 22, the semiconductor chip 21 may be connected to the pads 77 in the face opposite to the face 70a of the wiring board 70 from which the support member 71 is removed. In this case, the pads 74 in the face 70a of the wiring board 70 from which the support member 71 is removed are used as pads for connecting a mounting board (not shown).

Example 7

Hereinafter, another example of a wiring board in which a surface plated layer is projected from the surface of the wiring board will be described together with a method producing it.

Figure 23A:
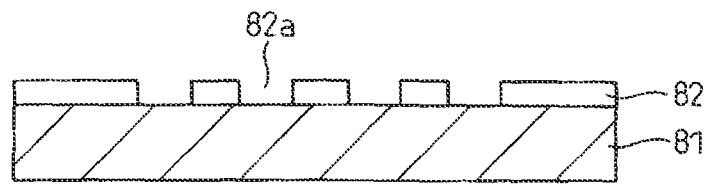
FIGS. 23A to 23F are first views illustrating a production of a wiring board of Example 7.
Figure 23B:
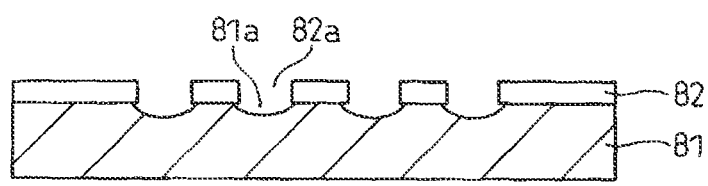
Figure 23C:
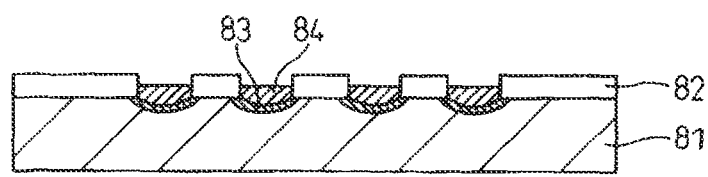

As shown in FIG. 23A, a plate resist pattern 82 having opening portions 82a is formed on the surface of a Cu plate serving as a support member 81 (a resist layer (not shown) is formed also on the rear face of the support member 81). The support member 81 is etched while using the resist pattern 82 as a mask, to form semispherical recesses 81a in the support member 81 (FIG. 23B). As shown in FIG. 23C, then, surface plated layers 83 (formed by an Au layer and a Ni layer) and external connection pads 84 made of Cu are sequentially formed by electrolytic plating in the recesses 81a.

Figure 23D:
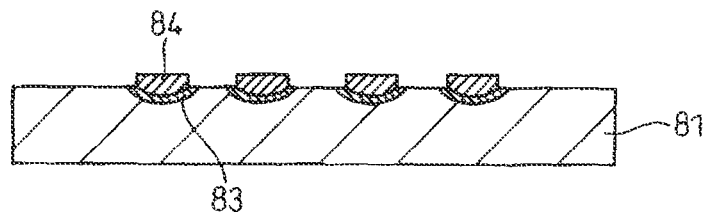
Figure 23E:
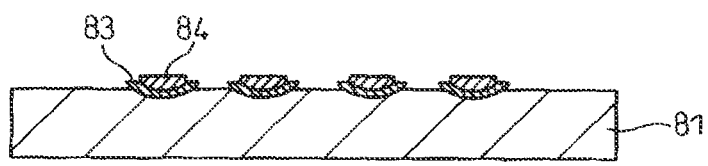
Figure 23F:
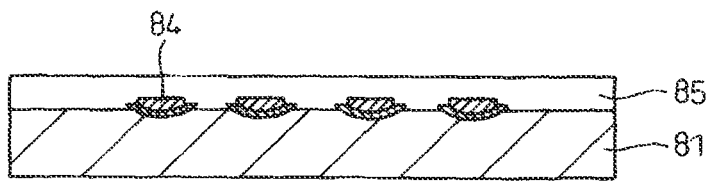

After the plate resist pattern 82 is removed (FIG. 23D), the Cu material is selectively etched so that, as shown in FIG. 23E, the outer peripheral edges of the pads 84 are made smaller by about 1 to 3 μm, and a part of the support member 81 made of the Cu material is dissolved away by side etching and undercut by an etchant, so that peripheral edge portions of the surface plated layers 83 on the side contacted with the support member 81 are exposed. Thereafter, a resin film is laminated over the whole face so as to cover the pads 84, thereby forming an insulating layer 85 (FIG. 23F).

Figure 24A:
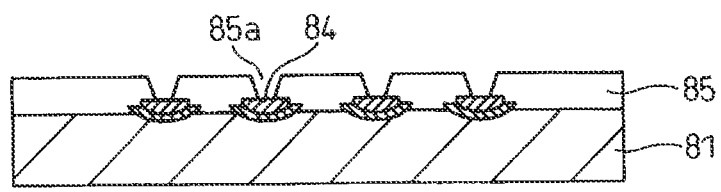
FIGS. 24A to 24D are second views illustrating a production of the wiring board of Example 7.
Figure 24B:
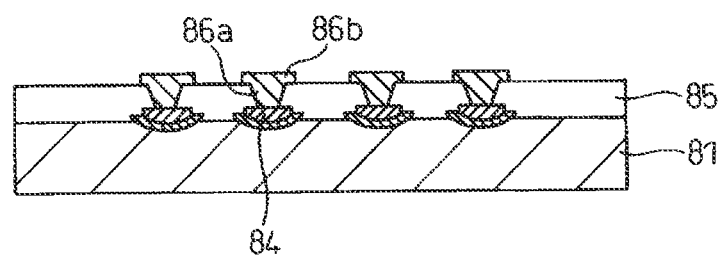

As shown in FIG. 24A, next, via holes 85a are formed in the insulating layer 85 by laser processing. As shown in FIG. 24B, thereafter, vias 86a connected to the pads 84, and a wiring pattern for a wiring layer 86b connected to the vias 86a are formed.

Figure 24C:
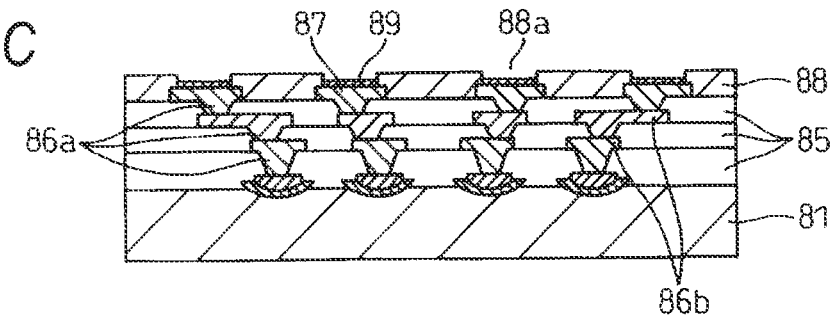
Figure 24D:
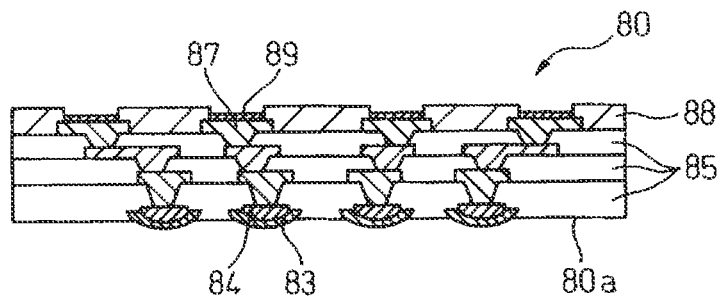

The formation of an insulating layer, and that of vias and a wiring layer are repeated to form predetermined numbers of insulating layers 85 and wiring layers 86b as shown in FIG. 24C, external connection pads 87 are formed together with a wiring pattern on the uppermost insulating layer 85, and thereafter a solder resist layer 88 having opening portions 88a which are connected to the pads 87 is formed. Next, surface plated layers 89 are formed by electroless plating on the pads 87 which are exposed in the opening portions 88a. Thereafter, the support member 81 is removed by etching, thereby completing a wiring board 80 as shown in FIG. 24D. In the wiring board 80, the peripheral edge portions of the surface plated layers 83 are covered by the insulating layer 85, and hence the adhesion strength of the surface plated layers 83 to the wiring board 80 is improved. In the wiring board 80, moreover, the pads 84 in the face 80a from which the support member 81 is removed are used as pads for connecting with a semiconductor chip or the like, and the pads 87 in the opposite face are used as pads for connecting with a mounting board.

Figure 25:
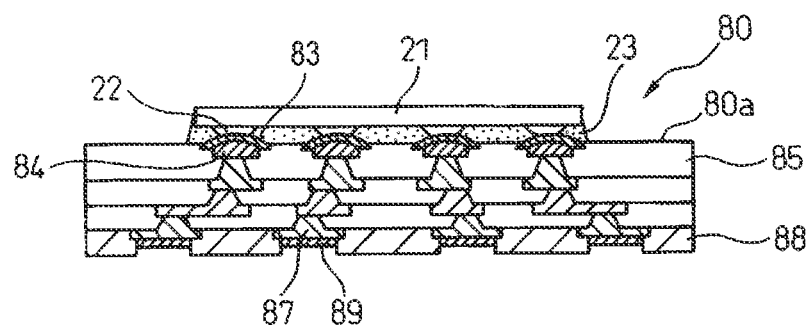
FIG. 25 is a view showing the wiring board of Example 7 on which a semiconductor chip is mounted.

FIG. 25 shows the wiring board 80 on which the semiconductor chip 21 is mounted. The semiconductor chip 21 is connected to the pads 84 of the wiring board 80, by the solder joining members 22 which are formed by reflowing bumps that are previously disposed on the semiconductor chip 21. The gap between the wiring board 80 and the semiconductor chip 21 is filled with the underfill resin 23.

Figure 26:
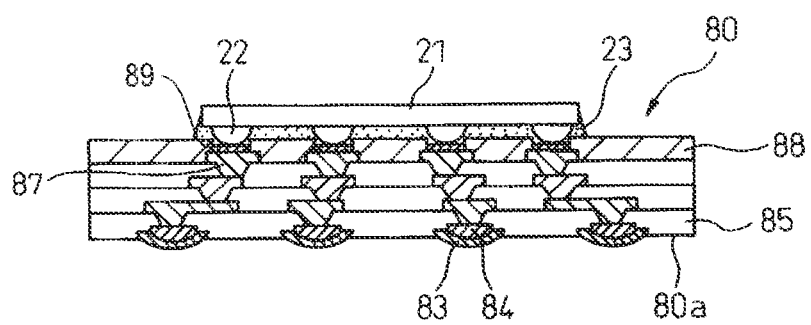
FIG. 26 is a view showing the wiring board of Example 7 in which a semiconductor chip is mounted on a face opposite to the case of the wiring board of FIG. 25.

As shown in FIG. 26, the semiconductor chip 21 may be connected to the pads 87 in the face opposite to the face 80a of the wiring board 80 from which the support member 81 is removed. In this case, the pads 84 in the face 80a of the wiring board 80 from which the support member 81 is removed are used as pads for connecting a mounting board (not shown).

While the present inventive concept has been shown and described with reference to certain exemplary embodiments thereof, it will be understood by those skilled in the art that various changes in form and details may be made therein without departing from the spirit and scope of the present invention as defined by the appended claims.

What is claimed is:

1. A wiring board comprising: wiring layers; vias protruding from an outermost one of the wiring layers so that the wiring layers respectively include vias; insulating layers disposed alternately with the wiring layers, an outermost one of the insulating layers covering the outermost one of the wiring layers so as to embed the vias therewithin, the outermost one of the insulating layers having recesses; connection pads respectively disposed within the recesses so as to be connected with the vias; and surface plated layers respectively disposed on the connection pads within the recesses, wherein an outer peripheral edge of each of the connection pads is retracted from an outer peripheral edge of a corresponding one of the surface plated layers toward a center of the connection pad, wherein an outermost face of each of the surface plated layers is indented from an outermost face of the outermost one of the insulating layers, wherein a peripheral edge portion of the outermost face of each of the surface plated layers is covered by one of said insulating layers of said wiring board, wherein each of the vias is connected to one face of a corresponding one of the connection pads, the one face being opposite to an other face on which a corresponding one of the surface plated layers is formed, wherein via holes are formed in the insulating layers, each of the via holes exposing the one face of the corresponding one of the connection pads, wherein each of the via holes has a circular truncated cone-like shape in which a diameter decreases towards the one face of the corresponding one of the connection pads, and wherein the vias are respectively provided in the via holes.

2. The wiring board according to claim 1, wherein the connections pads are:
 pads for mounting a semiconductor chip on the wiring board; or
 pads for mounting the wiring board on another electronic component.

3. The wiring board according to claim 1, wherein the connection pads are pads for mounting the wiring board on another board.

4. The wiring board according to claim 1, wherein each of the surface plated layers includes a plurality of plated layers.

5. The wiring board according to claim 1, wherein each of the connection pads is made of at least one of copper and a copper alloy.

6. The wiring board according to claim 1, wherein a rear face and a side face of each connection pad directly contact the outermost one of the insulating layers, and
 wherein a rear face and a side face of each surface plated layer directly contact the outermost one of the insulating layers.

7. The wiring board according to claim 1, wherein a rear face and a side face of each connection pad directly contact the outermost one of the insulating layers, and
 wherein a rear face and a side face of each surface plated layer directly contact the outermost one of the insulating layers.

8. The wiring board according to claim 4, wherein each of the surface plated layers is made of a gold layer and a nickel layer.

9. The wiring board according to claim 6, wherein, in each surface plated layer, the rear face is opposite to the outermost face.

10. The wiring board according to claim 7, wherein, in each surface plated layer, the rear face is opposite to the outermost face.

11. The wiring board comprising: wiring layers; vias protruding from an outermost one of the wiring layers so that the wiring layers respectively include vias; insulating layers disposed alternately with the wiring layers, an outermost one of the insulating layers covering the outermost one of the wiring layers so as to embed the vias therewithin, the outermost one of the insulating layers having recesses; connection pads respectively disposed within the recesses so as to be connected with the vias; and surface plated layers respectively disposed on the connection pads within the recesses, wherein an outer peripheral edge of each of the connection pads is retracted from an outer peripheral edge of a corresponding one of the surface plated layers toward a center of the connection pad, wherein the outer peripheral edge of each of the surface plated layers substantially matches with an inner peripheral wall of a corresponding one of the recesses, wherein an outermost face of each of the surface plated layers is indented from an outermost face of the outermost one of the insulating layers, wherein each of the surface plated layers is made of at least one of: (i) a tin layer and a silver layer; and (ii) a tin layer, wherein each of the vias is connected to one face of a corresponding one of the connection pads, the one face being opposite to an other face on which a corresponding one of the surface plated layers is formed, wherein via holes are formed in the insulating layers, each of the via holes exposing the one face of the corresponding one of the connection pads, wherein each of the via holes has a circular truncated cone-like shape in which a diameter decreases towards the one face of the corresponding one of the connection pads, and wherein the vias are respectively provided in the via holes.

12. A wiring board comprising:
wiring layers;
vias protruding from an outermost one of the wiring layers;
insulating layers disposed alternately with the wiring layers, an outermost one of the insulating layers covering the outermost one of the wiring layers so as to embed the vias therewithin, the outermost one of the insulating layers having recesses;
connection pads respectively disposed within the recesses so as to be connected with the vias; and
surface plated layers respectively disposed on the connection pads within the recesses,
wherein an outer peripheral edge of each of the connection pads is retracted from an outer peripheral edge of a corresponding one of the surface plated layers toward a center of the connection pad,
wherein the outer peripheral edge of each of the surface plated layers substantially matches with an inner peripheral wall of a corresponding one of the recesses,
wherein an outermost face of each of the surface plated layers is indented from an outermost face of the outermost one of the insulating layers,
wherein the wiring layers respectively include vias, wherein each of the vias is connected to one face of a corresponding one of the connection pads, the one face being opposite to an other face on which a corresponding one of the surface plated layers is formed,
wherein via holes are formed in the insulating layers, each of the via holes exposing the one face of the corresponding one of the connection pads,
wherein each of the via holes has a circular truncated cone-like shape in which a diameter decreases toward the one face of the corresponding one of the connection pads,
wherein the vias are respectively provided in the via holes, and
wherein the connection pads are:
pads for mounting a semiconductor chip on the wiring board; or
pads for mounting the wiring board on another electronic component.

13. The wiring board according to claim 12, wherein each of the surface plated layers is made of at least one of: (i) a tin layer and a silver layer; and (ii) a tin layer.

14. The wiring board according to claim 12, wherein each of the connection pads is made of at least one of copper and a copper alloy.

15. The wiring board according to claim 12, wherein each of the surface plated layers includes a plurality of plated layers, and each of the surface plated layers is made of a gold layer and a nickel layer.

* * * * *